United States Patent [19]

Kirita et al.

[11] Patent Number: 4,496,843
[45] Date of Patent: Jan. 29, 1985

[54] METHOD FOR PRODUCING METAL IONS

[75] Inventors: Kei Kirita; Katuo Koike, both of Tokyo, Japan

[73] Assignee: Tokyo Shibaura Denki Kabushiki Kaisha, Kawasaki, Japan

[21] Appl. No.: 382,777

[22] Filed: May 27, 1982

[30] Foreign Application Priority Data

Jun. 1, 1981 [JP] Japan ................................. 56-82517

[51] Int. Cl.$^3$ ............................................ H01J 27/00
[52] U.S. Cl. ................................... 250/426; 250/425; 250/423 R; 313/362.1
[58] Field of Search ............... 250/423 R, 425, 452.2, 250/426; 315/111.81; 313/163, 362.1

[56] References Cited

U.S. PATENT DOCUMENTS

| 2,882,408 | 4/1959 | Lofgren | 250/425 |
| 4,318,029 | 3/1982 | Jergenson | 250/423 R |
| 4,367,429 | 1/1983 | Wang et al. | 313/362.1 |

Primary Examiner—Bruce C. Anderson
Attorney, Agent, or Firm—Oblon, Fisher, Spivak, McClelland & Maier

[57] ABSTRACT

The invention provides a method for producing metal ions, having the steps of: producing a gas containing a metal element by evaporation of a liquid organic metal compound; introducing the gas containing the metal element and an auxiliary gas for cleaning into the ionization chamber; and producing the metal ions by ionizing the metal element by a discharge. According to this method, the metal ions are produced easily and quickly with good controllability.

11 Claims, 5 Drawing Figures

METHOD FOR PRODUCING METAL IONS

BACKGROUND OF THE INVENTION

The present invention relates to a method for producing metal ions and, more particularly, to an improved ion implantation method of a metal element.

A solid metal element or solid metal halide has been conventionally used as an ion source feed material for ion implantation of a metal element. In the ion implantation, a gas containing a predetermined metal element must be maintained in a plasma discharge state in an arc discharge chamber. In order to produce the gas plasma containing such a metal element, a gas containing a metal element vapor must be introduced into the arc discharge chamber. However, most of the metal elements or metal halides are solid under the normal temperature and pressure. Therefore, the solid metal element or solid metal halide has been used as the ion source feed material as described above.

The following problems are presented by a method using the solid metal element or solid metal halide as the ion source feed material:

(1) A heating oven is disposed adjacent to an ionization chamber (arc discharge chamber) and a metal vapor is produced in the heating oven. However, since the pressure of the metal vapor is controlled indirectly by controlling a temperature of the heating oven, the pressure of the metal vapor cannot be controlled properly.

(2) Since a given time interval is required to produce a gas plasma in a predetermined discharge state, an ion beam cannot be quickly produced. Furthermore, a given time interval is required to cool an oven, an arc discharge cannot be quickly stopped.

(3) Since the pressure of the metal vapor is unstable, the discharge state of the gas becomes unstable, and the ion beam becomes unstable accordingly.

(4) The discharge time interval is determined by the amount of the solid metal source introduced in the heating oven. In mass production, every time the solid metal source is consumed, a new solid metal source must be replenished. During the replenishing operation, ion implantation must be interrupted.

(5) When the metal halide is used as the solid metal source, more care must be taken since it has a high deliquescence. Further, when the interior of the ion implantation device is exposed to the ambient air after ion implantation, the metal halide which is attached to the inner wall of the device absorbs moisture in the air. The metal halide deposited on the inner wall of the device, that is, all the inner walls of the vacuum container member including the arc discharge chamber becomes viscous. Thus, the device itself is corroded by the viscous material and the vacuum state cannot be maintained in the device, resulting in serious damage.

The above problem is caused by the fact that ion source feed material such as In, Sb and $GaI_3$ are solid state material at the normal temperature.

SUMMARY OF THE INVENTION

It is, therefore, an object of the present invention to provide a method for producing a metal ion simply, quickly, and stably with good controllability.

In order to achieve the above object of the present invention, there is provided a method for producing metal ions, comprising the steps of: producing a gas containing a metal element by evaporation of a liquid organic metal compound; introducing the gas containing the metal element and an auxiliary gas for cleaning an ionization chamber into the ionization chamber; and producing the metal ions by ionizing the metal element by plasma discharge in the ionization chamber.

DETAILED DESCRIPTION OF THE PREFERRED EMBODIMENT

Figure 1:
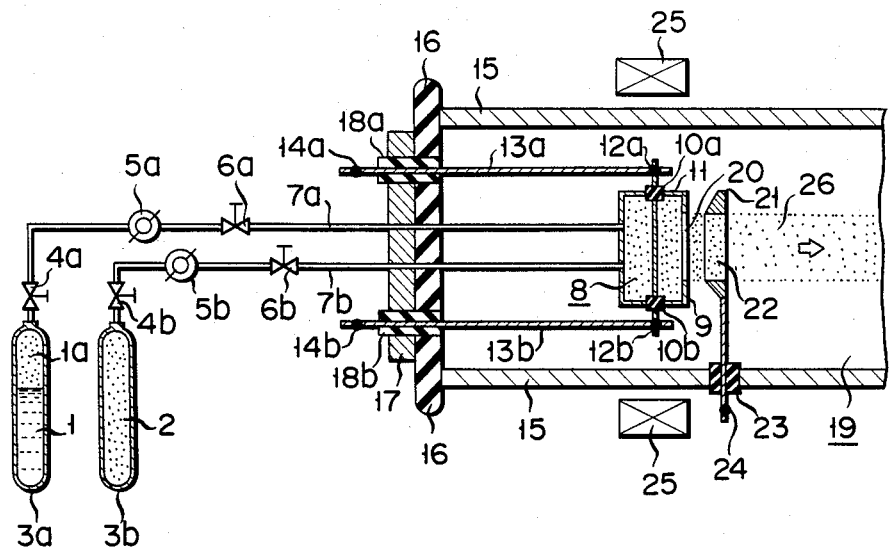
FIG. 1 is a sectional view of an ion producing portion of an ion implantation apparatus for practicing a method of the present invention.

A liquid organic metal compound is used as the metal ion source feed material in a method for producing metal ions according to the present invention. A gas containing a metal element produced by evaporation of the liquid organic metal compound is discharged to produce the metal ions. Since the organic metal compound is used as the ion source feed material, a contaminating material such as carbon produced by decomposition of the organic metal compound is attached on the inner wall of the device. In order to prevent this, an auxiliary gas for cleaning the interior of the device is introduced together with the organic metal compound gas in an ionization chamber according to the present invention.

An alkyl metal, metal alkoxide and the like are used as the liquid organic metal compound used in the method for producing the metal ions according to the present invention. Among them, a compound such as a methyl or ethyl metal and a metal methoxide or ethoxide which has a low boiling point and a small carbon number is preferred. If a compound having a high boiling point is used, heating means is required. Further, if a compound having a large carbon number is used, the interior of the device is contaminated by free carbon.

$Ga(CH_3)_3$, $Ga(C_2H_5)_2$ or the like is used as the liquid organic metal compound to produce Ga ions. $Hg(CH_3)_2$, $Hg(C_2H_5)_2$ or the like is used as the liquid organic metal compound to produce Hg ions. $In(CH_3)_3$, $In(C_2H_5)_3$ or the like is used as the liquid organic metal compound to produce In ions. $Sb(CH_3)_3$, $Sb(C_2H_5)_3$, $Sb(C_3H_7)_3$, $Sb(C_4H_9)_3$, $Sb(OCH_3)_3$, $Sb(OC_2H_5)_3$, $Sb(OC_3H_7)_3$, $Sb(OC_4H_9)_3$ or the like is used as the liquid organic metal compound to produce Sb ions. $Sn(CH_4)_4$, $Sn(C_2H_5)_4$, $Sn(C_3H_7)_4$, $Sn(C_4H_9)_4$ or the like is used as the liquid organic metal compound to produce Sn ions. $Zn(C_2H_5)_2$, $Zn(C_3H_7)_2$, $Zn(C_4H_9)_2$ or the like is used as the liquid organic metal compound to produce Zn ions. $Ta(OCH_3)_5$, $Ta(OC_2H_5)_5$ or the like is used as the liquid organic metal compound to produce Ta ions.

As an auxiliary gas used in the method for producing the metal ion according to the present invention, there may be used a fluoride gas such as $BF_3$, $SiF_4$, $GeF_4$, $PF_3$, $PF_4$, $AsF_3$, $AsF_5$ and the like; a rare gas such as He, Ne, Ar, Kr, Xe and the like; $H_2$ gas; Ne gas; a doping gas such as $AsH_3$, $PH_3$, $SbH_3$ and the like, and a gas mixture thereof.

A fluoride gas is preferred as the auxiliary gas. When the fluoride gas is used as the auxiliary gas, various materials such as hydrocarbon and metal mass, which are produced by decomposition of the organic metal compound gas during arc discharge, are prevent from attaching to the inner wall of the arc discharge chamber. Therefore, the inside of the arc discharge chamber is kept clean. Further, clogging of the gas inlet port is prevented and abnormal discharge is also prevented. Thus, stable arc discharge is maintained.

When a phosphorus fluoride gas such as $PF_3$ and $PF_4$ is used as the auxiliary gas to produce a Ga ion beam, the mass number 69 of $PF_2{}^+$ ions produced by arc-discharging the phosphorus fluoride gas is the same as that of Ga ions (naturally 60% contained isotope). In such cases an isotope ion (naturally 40% contained) of the mass number 71 is preferably selected by a mass analyzer and used as the Ga ion beam. Alternatively, when $GeF_4$ gas is used as the auxiliary gas to obtain the Ga ion beam, the produced Ge ions (including isotope ions of mass numbers 70, 72, 73, 74, and 76) should be compared with the Ga ions and analyzed by the mass analyzer with high resolution to obtain a highly pure Ga ion beam. $BF_3$, $SiF_4$, $AsF_3$, or $AsF_5$ gas is preferred as the fluoride gas.

With the fluoride gas as the auxiliary gas, the inside of the arc discharge chamber can be cleaned by a chemical reaction and sputtering. Further, the fluoride gas is dissociated to produce electrons to accelerate ionization of the metal element. Other gases except for the fluoride gas can clean the inside of the device by sputtering.

In order to produce the metal ions, using an ion source feed material and an auxiliary gas, the ion source feed material and the auxiliary gas must be carefully selected so as not to produce impurity ions in the ion beam analyzed by the mass analyzer. The ion source feed material and the auxiliary gas must be selected so as not to produce, by plasma discharge, ions having the same mass number as that of the metal ions to be produced. However, if ions having a mass number near that of the metal ions to be produced may be produced by plasma discharge, a mass analyzer with a high resolution must be used.

In order to produce arc discharge in the arc discharge chamber, the pressure in the arc discharge chamber is generally kept at $10^{-2}$ to $10^{-3}$ Torr. However, if the pressure does not reach the above range when an organic metal compound with a low vapor pressure is used as the ion source feed material, a container holding the ion source material may be heated to increase the vapor pressure.

A case will be described in which Ga ion implantation is performed using a hot cathode type (Freeman type) ion source.

FIG. 1 is a schematic sectional view of an ion producing portion of an ion implantation apparatus to which the method for producing the metal ions according to the present invention is applied. An ion source feed material is introduced into the arc discharge chamber and ionized to produce an ion beam. In this embodiment, trimethyl gallium ($Ga(CH_3)_3$) is used as the ion source feed material and boron trifluoride ($BF_3$) is used as the auxiliary gas. Reference numeral 1 denotes trimethyl gallium and reference numeral 2 denotes boron trifluoride. These are contained in gas cylinders 3a and 3b, respectively. Reference numeral 1a denotes $Ga(CH_3)_3$ vapor produced when the $Ga(CH_3)_3$ liquid is evaporated. Since the vapor pressure of $Ga(CH_3)_3$ at the ordinary temperature (25° C.) is as high as about 200 mmHg, the $Ga(CH_3)_3$ liquid is easily evaporated at the ordinary temperature. The pressure of the $BF_3$ gas within the gas cylinder 3b is about 100 kg/cm$^2$.

The $Ga(CH_3)_3$ vapor is introduced into an arc discharge chamber 8 through a pipe 7a which comprises a stop valve 4a, a pressure regulator 5a and a needle valve 6a. The $BF_3$ gas is introduced into the arc discharge chamber 8 through a pipe 7b which comprises a stop valve 4b, a pressure regulator 5b and a needle valve 6b. The arc discharge chamber 8 comprises a housing 9 made of a conductive material and a filament 11 for discharging thermions. The filament 11 is disposed to extend through the housing 9 via insulating members 10a and 10b. Both ends 12a and 12b of the filament 11 are connected to filament lead bars 13a and 13b, respectively. Ends 14a and 14b of the filament lead bars 13a and 13b, respectively, are connected to a filament electric source (not shown).

The arc discharge chamber 8 is generally housed in a vacuum container 19 which comprises a metal cylindrical body 15, an insulating plate 16 which closes an opening of the cylindrical body 15 and a metal ion source head 17 which is mounted on the insulating plate 16. The filament lead bars 13a and 13b are guided to outside the vacuum container 19 through insulating members 18a and 18b.

A slit 20 is formed in the side surface of the housing 9 which defines the arc discharge chamber 8. An extraction electrode 21 is disposed to face the slit 20 so as to extract the ion beams through the slit 20. The extraction electrode 21 has a slit 22 through which the ion beams pass. The extraction electrode 21 extends from the vacuum container 19 through an insulating member and is connected to an external electrode 24.

With the ion producing portion of the above arrangement, the steps of producing the ion beam containing Ga ions will be described below.

The vacuum container 19 is evacuated to a pressure of about 1 to $7 \times 10^{-6}$ Torr. The $Ga(CH_3)_3$ vapor and the $BF_3$ gas are separately introduced into the arc discharge chamber 8 through the pipes 7a and 7b, respectively. At this time, the valves 4a and 4b are open and the pressure regulators 5a and 5b are maintained at predetermined pressures. The needle valves 6a and 6b are controlled to maintain the flow rates of the vapor and the gas to be constant. More particularly, the needle valves 6a and 6b are controlled so as to stably perform gas arc discharge within the arc discharge chamber 8. For this purpose, the pressure in the arc discharge chamber 8 is kept at $10^{-2}$ to $10^{-3}$ Torr. The vapor and the gas are preferably introduced to maintain the same partial pressure. However, the arc discharge conditions may vary in accordance with a pressure in the vacuum container 19, the shape of the arc discharge chamber 8, the arc voltage, the wearing condition of the filament 11.

The vapor and the gas are introduced at predetermined flow rates, respectively. The pressure in the arc discharge chamber 8 is kept constant. Thereafter, an arc voltage of 100 to 200 V is applied between the filament 11 and the housing 9. When a current of 100 to 200 A flows into the filament 11, thermions emitted from the filament 11 bombard against the gas in the arc discharge chamber 8. Thus, ionization of the gas is initiated. The thermions emitted from the filament 11 and gas molecules ionized by the thermions are moved in a complex manner by an arc electric field and a circular magnetic field generated by a filament current in the arc discharge chamber 8. The chain reactions such as decomposition of the gas molecules and ionization of the gas occur. As a result, various molecule and atom groups in the arc discharge chamber 8 are ionized and kept in the ionized state. Generally, as shown in FIG. 1, the magnetic field is additionally applied in the axial direction of the filament 11 by magnets 25 disposed outside of the vacuum container 19. The charged particles in the arc discharge chamber 8 are moved in a more complex manner, so that ionization efficiency of the gas molecules and atoms is further increased to obtain a high-density plasma.

Since a voltage of 10 to 50 KV is applied between the housing 9 and the extraction electrode 21, an ion beam 26 is extracted from the arc discharge chamber 8 through the slit 20. The ion beam 26 includes all the atoms (including isotopes), molecules and ions which are produced by decomposition of the ion source feed material and the auxiliary gas during arc discharge.

The ion beam 26 is then guided to a known mass analyzer (not shown) and only a charged particle beam having a predetermined mass number is selected. In the above embodiment, only the Ga ion beam having the mass number 69 is selected by the mass analyzer and extracted therefrom. The extracted Ga ion beam is accelerated or decelerated to a predetermined energy and subsequently guided to a target sample chamber through a beam focusing system and a beam scanning system. Thus, Ga ions are ion-implanted into a sample. In this case, the dose is set and controlled by an external means. All the paths through which the ion beam passes must be maintained at high vacuum (generally, less than about $5 \times 10^{-6}$ Torr).

The effects according to the present invention will be summarized as follows.

First, according to the method of the present invention, the ion source feed material is extremely easily handled as compared with the conventional method. The operation time interval for replenishing the ion source feed material is shortened greatly. Ga metal, a Ga alloy and a Ga halide such as $GaF_3$, $GaCl_3$, $GaBr_3$ and $GaI_3$ have been conventionally used as the ion source feed materials in Ga ion implantation. However, all of the ion source feed materials of this type are solid materials, resulting in inconvenience. Since a halide has a high deliquescence, the inside of the arc discharge chamber and the vacuum container is contaminated and a long period of time is required for cleaning the inside thereof. However, according to the method of the present invention, since a liquid organic metal compound such as $Ga(CH_3)_3$ and $Ga(C_2H_5)$ is used, all the problems described above are solved.

Figure 2:
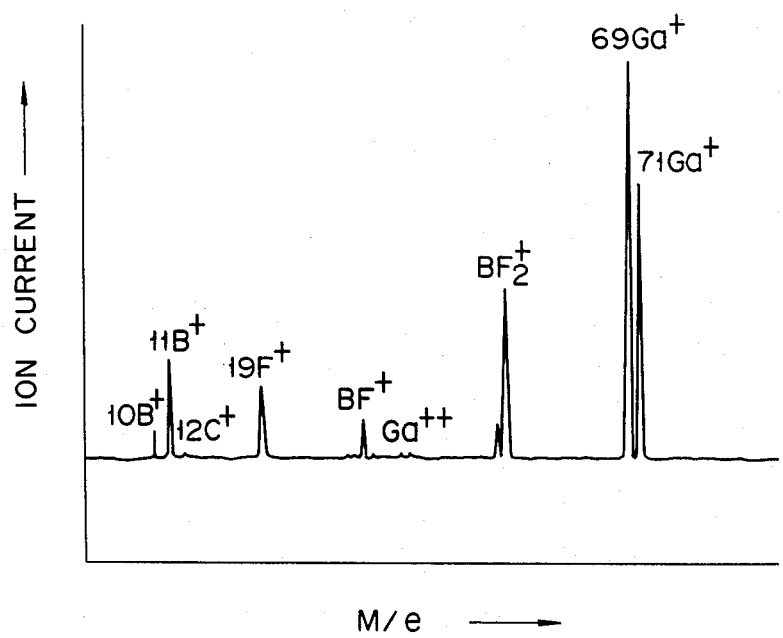
FIG. 2 shows a mass number spectrum of the produced ion when $Ga(CH_3)_3$ is used as the ion source feed material and $BF_3$ is used as an auxiliary gas.

Second, according to the method of the present invention, only an ion beam of a practically adequate ion current can be instantaneously reproduced. Further, as shown in FIG. 2, the resolution of the mass spectrum of the ion beam obtained in the above embodiment is excellent. Although the Ga isotopes include isotopes whose mass numbers are respectively 69 and 71, the Ga isotope having the mass number 69 which is available naturally in a greater amount is preferred.

Figure 3:
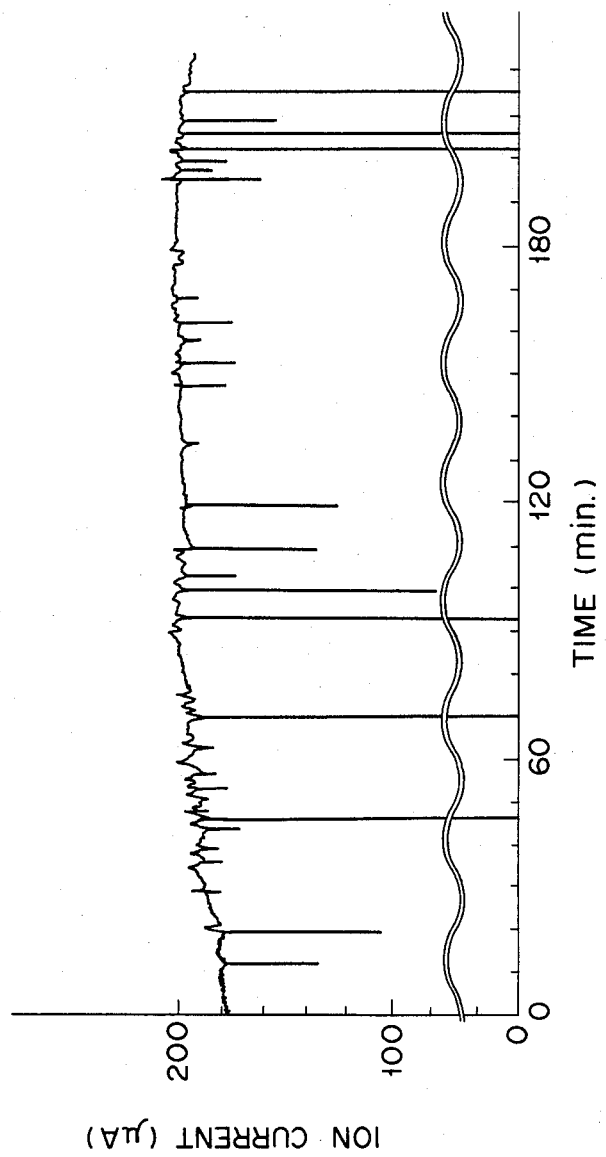
FIG. 3 is a graph showing changes with time in an Ga ion beam current when $GaI_3$ solid source is used as the ion source feed material and Ar is used as an auxiliary gas.
Figure 4:
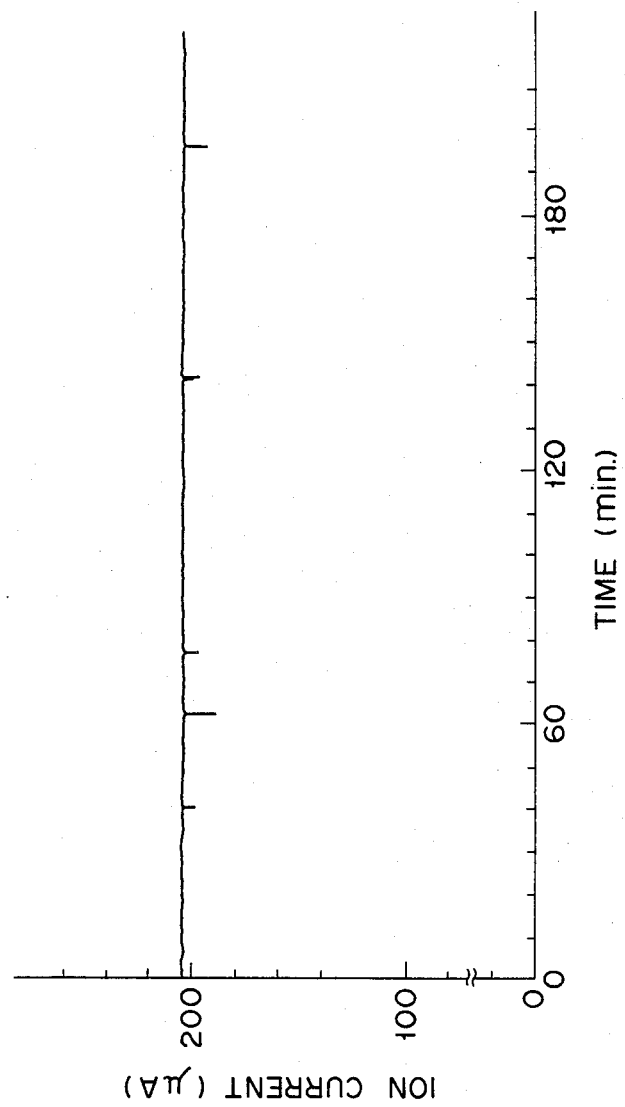
FIG. 4 is a graph showing changes with time in a Ga ion beam current when Ga ions are produced by the method of the present invention.

Third, according to the method of the present invention, the stable ion beam is obtained. FIG. 3 shows the changes with time in the ion current of Ga ions (mass number 69) obtained in the conventional method when $GaI_3$ is used as the ion source feed material and Ar is used as an auxiliary gas in a running test over 3 hours. FIG. 4 shows the changes with time in the ion current of Ga ions (mass number 69) obtained in the above embodiment in a running test over 3 hours. The both running tests were conducted at an arc voltage of about 100 V, at a filament current of about 120 A, and at an extraction voltage of about 25 KV. In the latter running test, the partial pressures of the $Ga(CH_3)_3$ gas and the $BF_3$ gas in the arc discharge chamber are substantially the same. The measured ion beam current is the value obtained when the target sample is scanned with the ion beam of 4" in diameter. The accelerating voltage of the ion beam is about 100 KeV. As is apparent from FIG. 4, the Ga ion current which is measured as 204 $\mu A$ at the initial period in the running test is kept almost constant. After 3 hours, it becomes about 201 $\mu A$ even though some small current noises are generated. Stability of the ion beam current proves practicability and easy mass production when the ion beam obtained by the method of the present invention is used for ion implantation.

Figure 5:
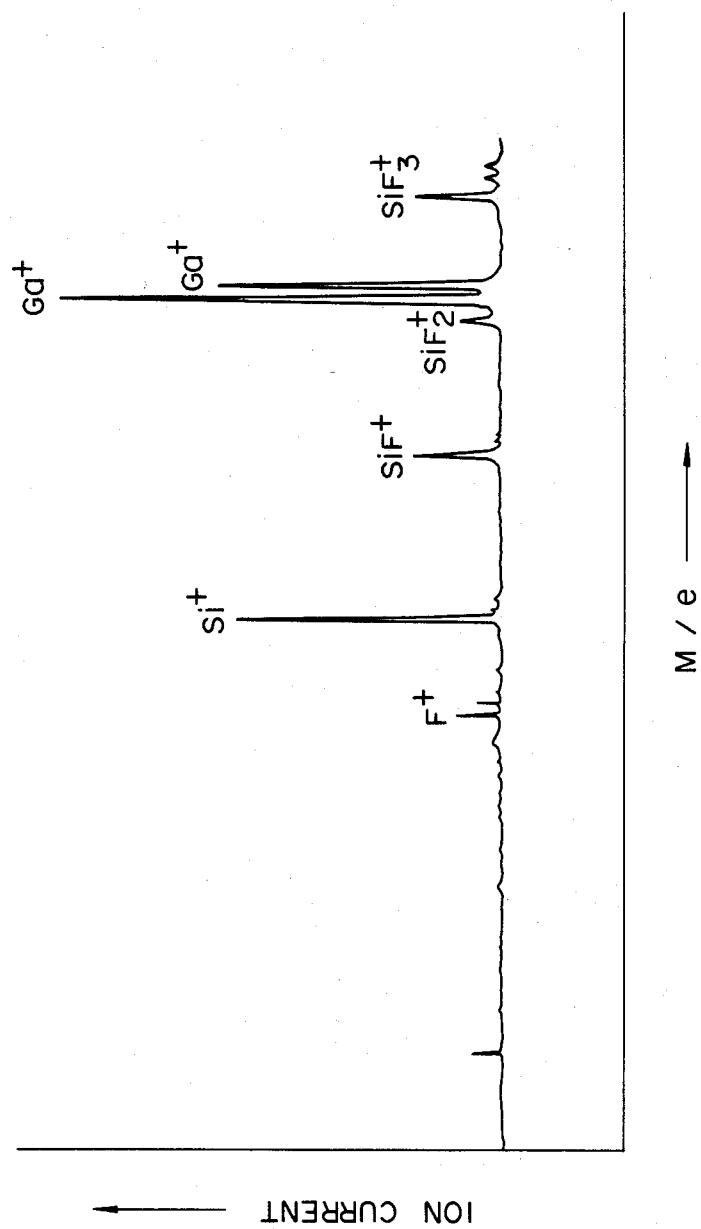
FIG. 5 shows a mass number spectrum of the produced ions when $Ga(CH_3)_3$ is used as the ion source feed material and $SiF_4$ is used as the auxiliary gas.

FIG. 5 shows a mass number spectrum of the ion beam obtained in the same manner as in the above embodiment except that the $SiF_4$ gas is used as the auxiliary gas. As is apparent from FIG. 5, even if the $SiF_4$ gas is used as the auxiliary gas to obtain the Ga ion beam, only Ga ions are analyzed with high resolution by the mass analyzer.

In the above embodiment, a hot cathode type ion source is used. A cold cathode type ion source may alternatively be used to obtain metal ions.

What we claim is:

1. A method for producing metal ions, comprising the steps of:
   (a) producing an organic metal compound vapor by evaporation of a liquid organic metal compound;
   (b) introducing said organic metal compound vapor and an auxiliary gas for cleaning an ionization chamber into said ionization chamber; and
   (c) producing the metal ions by decomposing said organic metal compound vapor by ionization in a discharge.

2. A method according to claim 1, wherein said liquid organic metal compound is a material selected from the group consisting of an alkyl metal and metal alkoxide.

3. A method according to claim 2, wherein said alkyl metal is a material selected from the group consisting of a methyl metal and an ethyl metal.

4. A method according to claim 2, wherein said metal alkoxide is a material selected from the group consisting of a metal methoxide and a metal ethoxide.

5. A method according to claim 1, wherein said auxiliary gas is a gas selected from the group consisting of a fluoride gas, a rare gas, $H_2$ gas, $N_2$ gas and mixtures thereof.

6. A method according to claim 5, wherein said fluoride gas is a gas selected from the group consisting of $BF_3$ gas, $SiF_4$ gas, $AsF_3$ gas, $AsF_5$ gas and mixtures thereof.

7. A method according to claim 1, wherein said discharge is arc discharge.

8. A method acording to claim 1, wherein said metal is selected from the group consisting of Ga, In, Hg, Sb, Sn, Zn and Ta.

9. A method according to claim 1, wherein said evaporation is conducted at ordinary temperature and under vacuum conditions of $10^{-2}$ to $10^{-3}$ Torr.

10. A method according to claim 1, wherein the liquid organic metal compound is $Ga(CH_3)_3$, and the auxiliary gas is $BF_3$.

11. A method according to claim 1, wherein said metal ion production is controlled by regulating the flow rate of said metal compound vapor to the ionization chamber.

* * * * *